(12) United States Patent
Fillion

(10) Patent No.: US 10,497,648 B2
(45) Date of Patent: Dec. 3, 2019

(54) EMBEDDED ELECTRONICS PACKAGE WITH MULTI-THICKNESS INTERCONNECT STRUCTURE AND METHOD OF MAKING SAME

(71) Applicant: General Electric Company, Schenectady, NY (US)

(72) Inventor: Raymond Albert Fillion, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/943,855

(22) Filed: Apr. 3, 2018

(65) Prior Publication Data

US 2019/0304910 A1    Oct. 3, 2019

(51) Int. Cl.
    *H01L 23/00*       (2006.01)
    *H01L 23/31*       (2006.01)
                  (Continued)

(52) U.S. Cl.
    CPC ........ *H01L 23/5286* (2013.01); *H01L 21/486* (2013.01); *H01L 21/768* (2013.01);
                  (Continued)

(58) Field of Classification Search
    CPC ..... H01L 23/5286; H01L 23/50; H01L 23/58; H01L 23/49827; H01L 23/49861;
                  (Continued)

(56) References Cited

U.S. PATENT DOCUMENTS 5,637,922 A    6/1997   Fillion et al.
7,791,897 B2   9/2010   Das et al.
               (Continued)

FOREIGN PATENT DOCUMENTS

JP       2015177163 A   10/2015
WO        0067538 A1    11/2000

OTHER PUBLICATIONS

Park et al., "Dielectric Composite Material with Good Performance and Process Ability for Embedding of Active and Passive Components into PCBs," Electronic Components and Technology Conference (ECTC), 2013 IEEE 63rd, pp. 1325-1331, Las Vegas, NV.

(Continued)

*Primary Examiner* — Long K Tran
(74) *Attorney, Agent, or Firm* — Ziolkowski Patent Solutions Group, SC

(57) ABSTRACT

An embedded electronics package and method of manufacture includes a support substrate, a power semiconductor component coupled to a first side of the support substrate, and a logic semiconductor component coupled to a second side of the support substrate, opposite the first side. A first insulating material surrounds the logic semiconductor component. A logic interconnect layer is electrically coupled to the logic semiconductor component by at least one conductive micro-via extending through a portion of the first insulating material. A power interconnect layer is electrically coupled to the power semiconductor component by at least one conductive macro-via extending through a thickness of the support substrate. The power interconnect layer is thicker than the logic interconnect layer.

33 Claims, 8 Drawing Sheets

(51) Int. Cl.

| | | |
|---|---|---|
| *H01L 23/528* | (2006.01) | |
| *H01L 27/088* | (2006.01) | |
| *H03K 19/0175* | (2006.01) | |
| *H01L 23/498* | (2006.01) | |
| *H01L 23/58* | (2006.01) | |
| *H01L 21/768* | (2006.01) | |
| *H01L 21/48* | (2006.01) | |
| *H01L 23/50* | (2006.01) | |

(52) U.S. Cl.
CPC .. *H01L 23/49827* (2013.01); *H01L 23/49861* (2013.01); *H01L 23/50* (2013.01); *H01L 23/58* (2013.01); *H01L 27/088* (2013.01); *H03K 19/017545* (2013.01)

(58) Field of Classification Search
CPC ... H01L 21/486; H01L 21/768; H01L 27/088; H03K 19/017545
USPC ........ 257/500, 666, 676, 686, 732, 777, 778
See application file for complete search history.

(56) References Cited

U.S. PATENT DOCUMENTS

| | | | |
|---|---|---|---|
| 8,049,338 | B2 | 11/2011 | Delgado et al. |
| 8,114,712 | B1 | 2/2012 | McConnelee et al. |
| 8,334,593 | B2 | 12/2012 | McConnelee et al. |
| 8,368,201 | B2 | 2/2013 | Tuominen |
| 8,466,007 | B2 | 6/2013 | Delgado et al. |
| 8,716,870 | B2 | 5/2014 | Gowda |
| 8,778,738 | B1 | 7/2014 | Lin et al. |
| 8,987,876 | B2 | 3/2015 | Gowda et al. |
| 9,177,957 | B1 | 11/2015 | Lee et al. |
| 9,209,151 | B2 | 12/2015 | Chauhan et al. |
| 2003/0178388 | A1* | 9/2003 | Phillips .................. H05K 1/113 216/13 |
| 2005/0062172 | A1* | 3/2005 | Low ...................... H01L 21/561 257/787 |
| 2006/0019505 | A1* | 1/2006 | Cooper ............... B32B 37/0015 439/55 |
| 2007/0155057 | A1 | 7/2007 | Wang |
| 2007/0235810 | A1 | 10/2007 | Delgado et al. |
| 2008/0136002 | A1* | 6/2008 | Yang ...................... H01L 24/82 257/686 |
| 2008/0296056 | A1 | 12/2008 | Kinoshita et al. |
| 2008/0318027 | A1 | 12/2008 | Woychik et al. |
| 2009/0039510 | A1 | 2/2009 | Jobetto |
| 2009/0072379 | A1 | 3/2009 | Ewe et al. |
| 2010/0052129 | A1 | 3/2010 | Iihola et al. |
| 2010/0059854 | A1 | 3/2010 | Lin et al. |
| 2011/0068461 | A1 | 3/2011 | England |
| 2012/0018876 | A1 | 1/2012 | Wu et al. |
| 2013/0075924 | A1 | 3/2013 | Lin et al. |
| 2013/0093097 | A1 | 4/2013 | Yu et al. |
| 2013/0099373 | A1* | 4/2013 | Kwon ............... H01L 23/49811 257/737 |
| 2014/0264799 | A1 | 9/2014 | Gowda et al. |
| 2015/0115458 | A1 | 4/2015 | Palm |
| 2015/0179616 | A1 | 6/2015 | Lin et al. |
| 2015/0380356 | A1 | 12/2015 | Chauhan et al. |
| 2016/0056136 | A1 | 2/2016 | McConnelee et al. |
| 2016/0148887 | A1 | 5/2016 | Yu et al. |
| 2016/0155693 | A1* | 6/2016 | Smith ..................... H01L 24/82 257/770 |
| 2016/0172344 | A1 | 6/2016 | We et al. |
| 2017/0207160 | A1* | 7/2017 | Gowda ............. H01L 23/49838 |

OTHER PUBLICATIONS

Braun et al., "Through Mold Vias for Stacking of Mold Embedded Packages," Electronic Components and Technology Conference (ECTC), 2011 IEEE 61st, pp. 48-54, May 31, 2011-Jun. 3, 2011, Lake Buena Vista, FL.

* cited by examiner

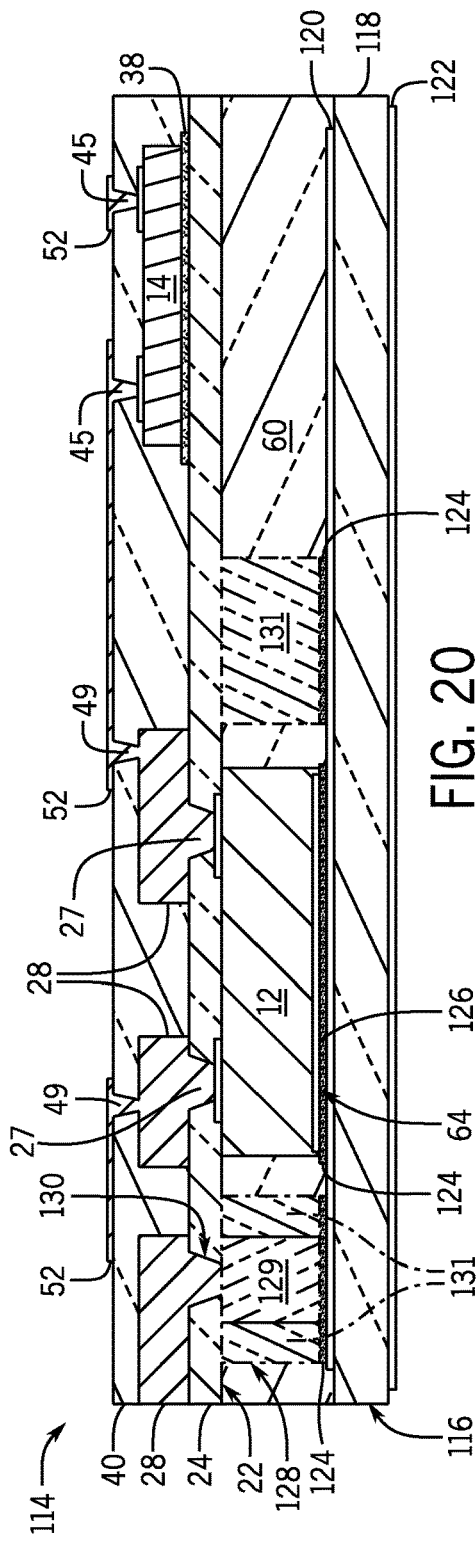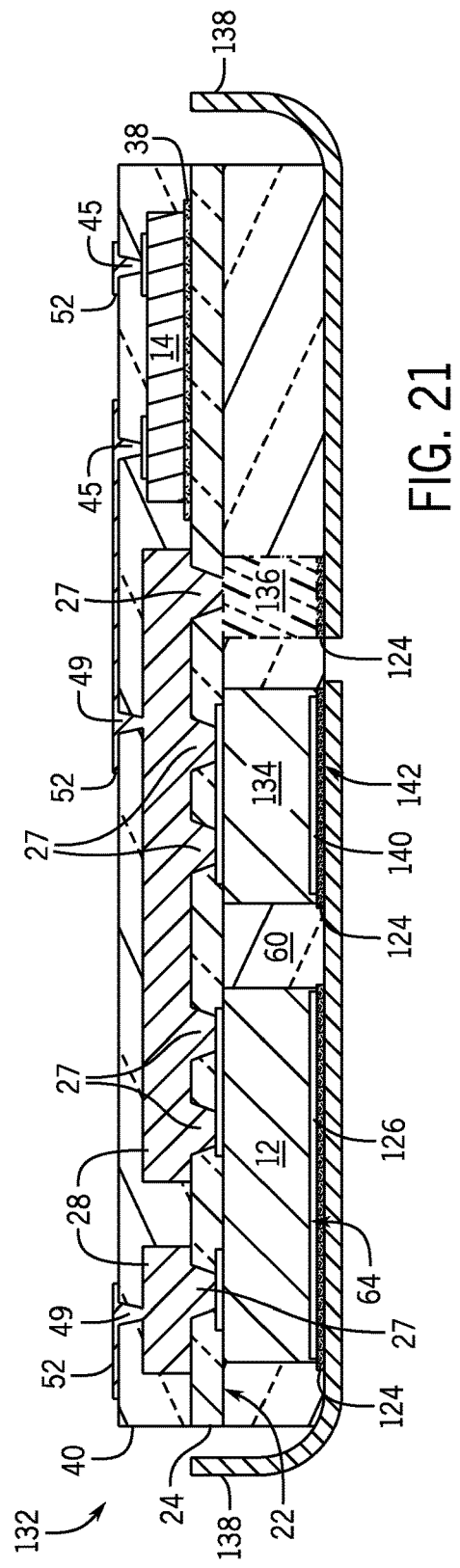

EMBEDDED ELECTRONICS PACKAGE WITH MULTI-THICKNESS INTERCONNECT STRUCTURE AND METHOD OF MAKING SAME

BACKGROUND OF THE INVENTION

Embodiments of the invention relate generally to structures and methods for packaging semiconductor devices and, more particularly, to an electronics package structure that facilitates the integration of different types of electrical components, such as power semiconductor devices and control or digital logic semiconductor devices, in a common package structure.

As semiconductor device packages have become increasingly smaller and yield better operating performance, packaging technology has correspondingly evolved from leaded packaging, to laminated-based ball grid array (BGA) packaging, to chip scale packaging (CSP), then flip chip packages, and now buried die/embedded chip build-up packaging. Advancements in semiconductor chip packaging technology are driven by ever-increasing needs for achieving better performance, greater miniaturization, and higher reliability.

A challenge to existing manufacturing techniques is the miniaturization of electronics packages that incorporate different types of individually packaged electronics components that have different current carrying and routing density requirements, such as a mixture digital logic semiconductor devices and power semiconductor devices.

Numerous different packaging and interconnection technologies are used in the field of power electronics, including hybrid circuits, multichip modules, package-on-board assemblies, and embedded chip modules. Hybrid circuits typically have a multilayer ceramic substrate, wire bonded chips attached to the substrate, and multiple thin film or thick film passive elements formed within or on the substrate. Multichip modules typically have a multilayer organic substrate, wire bonded chips attached to the substrate, and discrete passive devices attached on top on the substrate. Package-on-board assemblies typically include individually packaged semiconductor devices and discrete passive devices surface mounted on a printed circuit board (PCB). Embedded chip power electronics technologies represent a newer packaging approach to power electronics. In this approach, one or more power semiconductor chips is embedded within or under an organic interconnect structure that has one or more organic dielectric layers and patterned interconnect layer over or over and under the chips. A key feature of embedded chip modules is that metallized vias formed through the organic dielectric directly connect to the chip input/output (I/O) pads, eliminating wire bonds and flip chip solder bumps. The via structure has an order of magnitude lower interconnect resistance and interconnect inductance compared to wire bonds or solder bumps.

Many power electronics packages or circuits are used in high voltage power applications and are designed to carry a large amount of current and/or support a large voltage and/or high-power dissipation. These power electronics packages include power semiconductor devices that require interconnection elements that have the capacity to handle high currents and high voltage levels. Power semiconductor devices that are individually packaged, such as a leadless wire-bonded ceramic or plastic chip carriers, include multiple thick wire bonds to connect the high current pads on the chip to the package leadframe. The carrier leadframe and I/O terminals also include thick, wide conductive elements such as pads or leads. Likewise, the circuit board upon which the power chip carrier is mounted includes wide power traces or preferably power/ground planes to provide the desired current carrying capacity.

Typical power electronics circuits also include low or lower power semiconductor devices to provide logic and control functions, including drive circuitry, feedback circuits, and the like. These logic electronics devices have different design requirements than the power semiconductor chip(s) and power interconnection elements, including lower voltage levels, lower current levels, smaller device pads, and more I/O terminals per device.

In typical power electronics using single-chip, chip carrier packages for both high power and logic devices that are mounted on a circuit board, the packages for high power semiconductor devices include structures designed for high voltage, current and power dissipation and the packages for lower power logic components include structures designed for low voltage, current and power dissipation. These packaging structures are solder attached to a power circuit board which has both wide high current carrying traces/planes for the power interconnections and narrow, low current carrying traces.

The fabrication of an embedded chip power module having both high power semiconductor chips and low power logic semiconductor chips is complicated with the concurrent need for thick and thin insulating layers, different interconnect thicknesses for high power semiconductor chips and logic semiconductor chips, and large and small vias. Various approaches have been proposed to efficiently handle the divergent requirements of power semiconductor chips and logic semiconductor chips within the same embedded chip modules. However, these prior art solutions fail to provide reliable interconnect structures that efficiently provide electrical connections for logic or control semiconductor devices within the power module.

Accordingly, there is a need for an embedded power module that efficiently provides interconnections for different types of electrical components, such as high-power semiconductor devices and lower power semiconductor devices, including logic and control components.

BRIEF DESCRIPTION OF THE INVENTION

In accordance with one aspect of the invention, an embedded electronics package includes a support substrate, a power semiconductor component coupled to a first side of the support substrate, and a logic semiconductor component coupled to a second side of the support substrate, opposite the first side. A first insulating material surrounds the logic semiconductor component. A logic interconnect layer is electrically coupled to the logic semiconductor component by at least one conductive micro-via extending through a portion of the first insulating material. A first power interconnect layer is electrically coupled to the power semiconductor component by at least one conductive macro-via extending through a thickness of the support substrate. The first power interconnect layer is thicker than the logic interconnect layer.

In accordance with another aspect of the invention, a method of manufacturing an embedded electronics package includes coupling a power semiconductor component to a first side of a support substrate and forming a power interconnect layer on a second side of the support substrate, the power interconnect layer extending through at least one macro-via in the support substrate to electrically couple with the power semiconductor component. The method also includes coupling a logic semiconductor component to the second side of the support substrate, surrounding the logic semiconductor component in a first insulating material, and forming a logic interconnect layer on a top surface of the first insulating material, the logic interconnect layer extending through at least one micro-via in the first insulating material to electrically couple with the logic semiconductor component, the logic interconnect layer thinner than the power interconnect layer.

In accordance with another aspect of the invention, an electronics package includes an insulating substrate and a first electronic component having an active surface coupled to a first side of the insulating substrate. The active surface has at least one input/output (I/O) pad. The electronics package also includes a second electronic component having a non-active surface coupled to a second side of the insulating substrate and an active surface opposite the non-active surface. A first interconnect layer is coupled to the second side of the insulating substrate and extends through at least one conductive macro-via in the insulating substrate to electrically couple the first interconnect layer to the at least one I/O pad of the first electronic component. The electronics package also includes a second interconnect layer having a thickness less than a thickness of the first interconnect layer. The second interconnect layer extends through at least one conductive micro-via to contact at least one I/O pad on the active surface of the second electronic component.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIG. 20 is a schematic cross-sectional view of an electronics package that includes a multi-layer back side interconnect structure, according to an embodiment of the invention.

FIG. 21 is a schematic cross-sectional view of an electronics package that includes a simplified back side interconnect structure, according to another embodiment of the invention.

DETAILED DESCRIPTION

Figure 1:
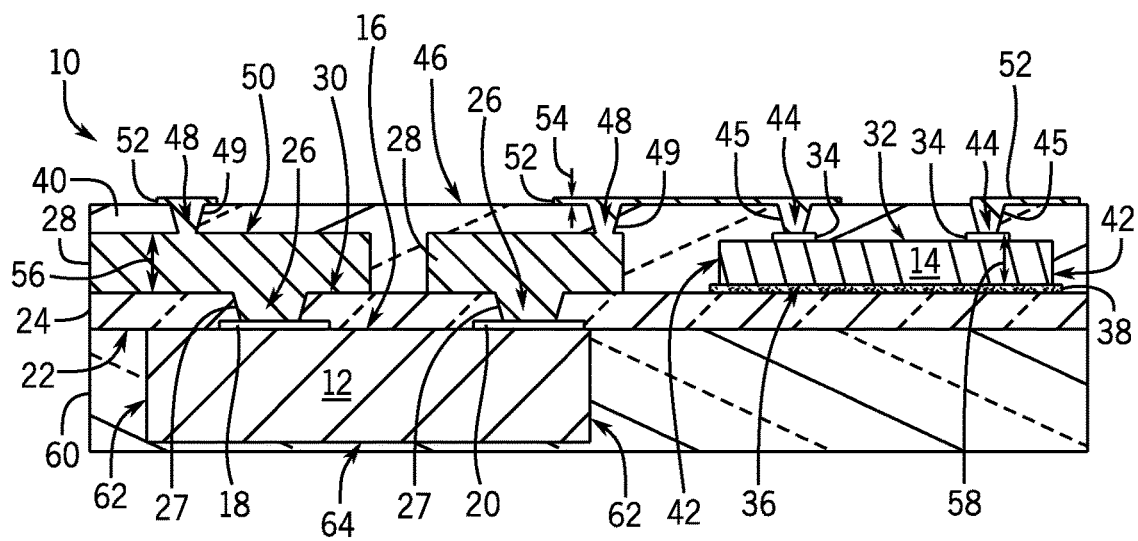
FIG. 1 is a schematic cross-sectional side view of an electronics package, according to an embodiment of the invention.

Embodiments of the present invention provide for an embedded electronics package that includes a mixture of different types of electrical components, such as a power semiconductor component and a logic semiconductor component. The electronics package includes a multi-thickness interconnect structure that includes an arrangement of thick and thin conductive interconnect layers that provide electrical interconnections for the different types of electrical components.

As used herein, the phrase "power semiconductor component" refers to a semiconductor component, device, die, or chip designed to carry a large amount of current and/or support a large voltage. As used herein, the phrase "power semiconductor device" may refer to packaged and unpackaged power semiconductor components, while the phrase "power semiconductor chip" refers to an unpackaged power semiconductor component such as diced element or die. Power semiconductor components are typically used as electrically controllable switches or rectifiers in power electronic circuits, such as switched mode power supplies, for example, and are usually used in an On/Off mode (commutation mode) rather than a linear mode. Non-limiting examples of power semiconductor devices include insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), and Gallium Arsenide (GaAs). In use, power semiconductor components are typically mounted to an external circuit by way of a packaging structure, with the packaging structure providing an electrical connection to the external circuit, providing a way to remove the heat generated by the devices and protect the devices from the external environment. Typical power semiconductor components include two (2) to four (4) input/output (I/O) interconnections, which are alternatively referred to as contacts, contact pads, or terminal pads, although some more complex power devices with additional internal controls and feed-back elements can have 10 to 20 I/O interconnections. The component I/O connections are electrically coupled to internal elements within the semiconductor component used to electrically connect a respective power semiconductor component to an external circuit.

As used herein, the phrase "logic semiconductor component" refers to a semiconductor component, device, die, or chip provided in the form of a digital, analog, or mixed digital/analog component that operates at a lower power than a power semiconductor component and provides logic and control functions, gate drive circuitry, communication, feedback, and the like. Non-limiting examples of logic semiconductor components include microprocessors, microcontrollers, memory devices, video processors, Application Specific Integrated Circuits (ASIC), and the like. As is understood in the art, logic semiconductor components have reduced current carrying requirements, generally operate at low voltages and require increased numbers of I/O interconnections as compared to power semiconductor components due to the differences in interconnection pitch, number of I/Os, and relative size of I/Os between the device types. A logic semiconductor component may include anywhere from less than ten and to more than one thousand I/Os depending on the component configuration.

While the various embodiments of an electronics package referenced below are shown and described as including a particular arrangement of a semiconductor device or devices, interconnection wiring and electronic package terminals, it is understood that alternative arrangements and configurations could also be implemented and thus embodiments of the invention are not limited only to the specifically illustrated devices and arrangements thereof. Thus, while the electronics packages disclosed herein are described as including one or more power semiconductor devices in combination with one or more logic semiconductor components, it is understood that other combinations of differently configured electrical components could be substituted in the electronics package, and thus embodiments of the invention are not limited only to the embedding of power components and logic components in a common electronics package. For example, while the embodiments of FIGS. 1-21 are described as including one power component and one logic components, it is contemplated that the concepts described herein may be extended to electronics packages that include any combination of three or more electrical components. As used herein the term "electrical component" may be understood to encompass any of the various types of semiconductor devices described above as well as resistors, capacitors, inductors, filters, and other circuit devices.

Additionally, the multi-thickness interconnect structure and the disclosed method of manufacturing may be extended to electronics packages with any combination of electrical components having differing current carrying capabilities and routing density structures. Thus, the electronics package embodiments described below should also be understood to encompass electronics packages including acoustic devices, microwave devices, millimeter devices, RF communication devices, micro-mechanical (MEMS) devices, resistors, capacitors, inductors, filters, or other similar devices, provided either alone or in combination with one or more power or digital logic components.

Referring now to FIG. 1, a cross-sectional schematic view of an electronics module 10 that includes at least one power semiconductor component or chip 12 and at least one logic semiconductor component or chip 14. Power semiconductor chip 12 has an active surface 16 with at least one contact pad or I/O pad 18, 20 thereon. The active surface 16 of power semiconductor chip 12 is coupled to the bottom surface 22 of an insulating substrate 24 or support substrate. According to various embodiments, insulating substrate 24 may be provided in the form of an insulating film or dielectric substrate, such as for example a Kapton® laminate flex, an organic film or substrate comprising polyimide, epoxy, BT resin, although other suitable materials may also be employed, such as Ultem®, polytetrafluoroethylene (PTFE), or another polymer film, such as a liquid crystal polymer (LCP) or a polyimide substrate, or inorganic substrates such as Si, SiC, AlN, ceramic, or glass, as non-limiting examples.

At least one macro-via 26 extends between the top surface 30 to the bottom surface 22 of insulating substrate 24. Macro-via(s) 26 are aligned with the I/O pad(s) 18, 20 of the power semiconductor chip 12. In preferred embodiments, macro-via(s) 26 are wider than they are deep, with the width of the macro-via(s) 26 measured at the midpoint of the macro-via(s) 26. Thus, macro-via(s) 26 (and the corresponding conductive macro-via(s) 27) have an aspect ratio that is greater than one.

An electrically conductive first interconnect layer 28 or power interconnect layer is disposed on a portion of the top surface 30 of insulating substrate 24. The first interconnect layer 28 extends into the macro-via(s) 26, forming conductive macro-via(s) 27, and also extends onto the I/O pad(s) 18, 20 of power semiconductor chip 12. First interconnect layer 28 is an electrically conductive material and, preferably, is composed of one or more metals such as aluminum, copper, gold, silver, nickel, or combinations thereof as non-limiting examples. Alternatively, first interconnect layer 28 may be an electrically conductive polymer or formed using inks that contain conductive metal particles.

First interconnect layer 28 may be composed of a barrier or adhesion layer, a seed layer, and a relatively thick layer of bulk material that is plated atop the seed and barrier layers achieving the desired conductive layer thickness. In alternative embodiments, the barrier layer and/or the seed layer may be omitted from first interconnect layer 28. The barrier layer, when used, is applied to the insulating substrate 24 prior to application of the seed layer and bulk material. The barrier layer may include titanium or chromium, as non-limiting examples. When used, seed metal layer may be an electrically conductive material such as copper, as one non-limiting example. The layer of bulk material is plated up to achieve the desired thickness of first interconnect layer 28. The bulk material portion of first interconnect layer 28 includes at least one electrically conductive material such as copper, aluminum, or other standard wiring material. In some embodiments the barrier layer may have a thickness in the approximate range of 0.1 to 0.4 microns, the seed metal layer may have a thickness in the approximate range of 1 to 3 microns and the bulk layer may have a thickness in the approximate range of 10 to 100 microns. However, other materials at other thicknesses can be used to form first interconnect layer 28 based on design requirements.

Logic semiconductor chip 14 has an active surface 32 that includes a plurality of contact pads or I/O pads 34. The non-active or backside surface 36 of logic semiconductor chip 14 is coupled to the top surface 30 of insulating substrate 24 by way of bonding material 38, such that the active surface 32 faces away from insulating substrate 24. As used herein the phrase "bonding material" refers to an electrically insulating material that adheres to surrounding components of the electronics package. Bonding material 38 is preferably a non-electrically conducting polymeric material (e.g., epoxy, liquid crystal polymer, ceramic or metal filled polymers) or other organic material as non-limiting examples. In other preferred embodiments, bonding material 38 may be electrically conducting such as, for example, a polymeric material containing conductive particles.

A first encapsulant or insulating material 40 covers at least a portion of the side surfaces 42 and active surface of logic semiconductor chip 14, exposed portions of the top surface 30 of insulating substrate 24, and first interconnect layer 28. In the illustrated embodiment, insulating material 40 fully encapsulates logic semiconductor chip 14. In alternative embodiments, such as embodiments where logic semiconductor chip 14 is an optical component and active surface 32 has optical functionality, an opening may be formed within insulating material 40 above a portion of the active surface 32 of logic semiconductor chip 14. In yet another embodiment, at least a portion of the insulating material 40 located above the active surface 32 is provided as an optically transparent material.

Micro-vias 44 pass from a top surface 46 of the insulating material 40 down through a portion of the thickness of the insulating material 40 to expose I/O pads 34 on logic semiconductor chip 14. Optionally, one or more additional micro-vias 48 are formed down to the top surface 50 of first interconnect layer 28. Micro-vias 44, 48 have a smaller diameter or cross-sectional area than that of macro-via(s) 26. In preferred embodiments, micro-vias 44, 48 are narrower in width than they are deep, with the width measured at a midpoint of the corresponding micro-vias 44, 48. Thus micro-vias 44, 48 (and their corresponding conductive micro-vias 45, 49) have an aspect ratio that is less than one. In preferred embodiments, the cross-sectional area of macro-vias 26 is at least twice as large as the cross-sectional area of micro-vias 44, 48, with the cross-sectional areas measured at the midpoints of the macro-vias 26 and micro-vias 44, 48. In an alternative embodiment, the cross-sectional area of macro-vias 26 is at least four times as large as the cross-sectional area of micro-vias 44, 48. In yet another alternative embodiment, the cross-sectional area of macro-vias 26 is at least ten times as large as the cross-sectional area of micro-vias 44, 48.

An electrically conductive second interconnect layer 52 or logic interconnect layer is disposed on the top surface 46 of the insulating material 40. The second interconnect layer 52 extends into micro-vias 44, 48 forming conductive micro-vias 45, 49 that electrically connect second interconnect layer 52 to I/O pads 34 of logic semiconductor chip 14 and to first interconnect layer 28. Together, first and second interconnect layers 28, 52 form a multi-thickness interconnect structure.

The second interconnect layer 52 has a thickness 54 that is less than a thickness 56 of the first interconnect layer 28. In some embodiments, thickness 56 is at least ten times greater than thickness 54. The thickness 56 will be based on the current carrying specifications of the power semiconductor chip 12. Second interconnect layer 52 may include any of the materials described with respect to first interconnect layer 28. Thus, second interconnect layer 52 includes a plated-up layer of bulk conductive material such as, for example, copper. In some embodiments, second interconnect layer 52 also includes a seed layer and/or a barrier layer.

In the embodiments illustrated herein, the conductive macro-vias 27 and conductive micro-vias 45, 49 are depicted as fully filling the corresponding macro-vias 26 and micro-vias 44, 48. Alternatively, any of the conductive macro-vias and/or conductive micro-vias described herein may be conformal vias where the conductive material coats only the sides and bottom of the via openings.

In the embodiments described herein, thickness 56 of first interconnect layer 28 may be in the range of 10 μm-100 μm and thickness 54 of second interconnect layer 52 may be in the range of 4 μm-30 μm. However, it is contemplated that first and second conductive layers 28, 52 may be formed having thicknesses outside these ranges of values in alternative embodiments. In some embodiments, the thickness 56 of first interconnect layer 28 is equal to, substantially equal to, or greater than a thickness 58 of the logic semiconductor chip 14 resulting in the top surface 50 of first interconnect layer 28 being co-planar or substantially co-planar with the active surface 32 of logic semiconductor chip 14. As used herein, the term "substantially" is accommodative of up to about a ten percent deviation. In other embodiments, the thickness 58 of logic semiconductor chip 14 is less than one and one-half times the thickness 56 of the first interconnect layer 28.

A second encapsulant or insulating material 60 covers at least portions of the side surfaces 62 the power semiconductor chip 12 and the exposed portions of the bottom surface 22 of insulating substrate 24. In some embodiments, such as the embodiment shown in FIG. 1, insulating material 60 encapsulates the entirety of the side surfaces 62 and backside surface 64 of power semiconductor chip 12.

Figure 2:
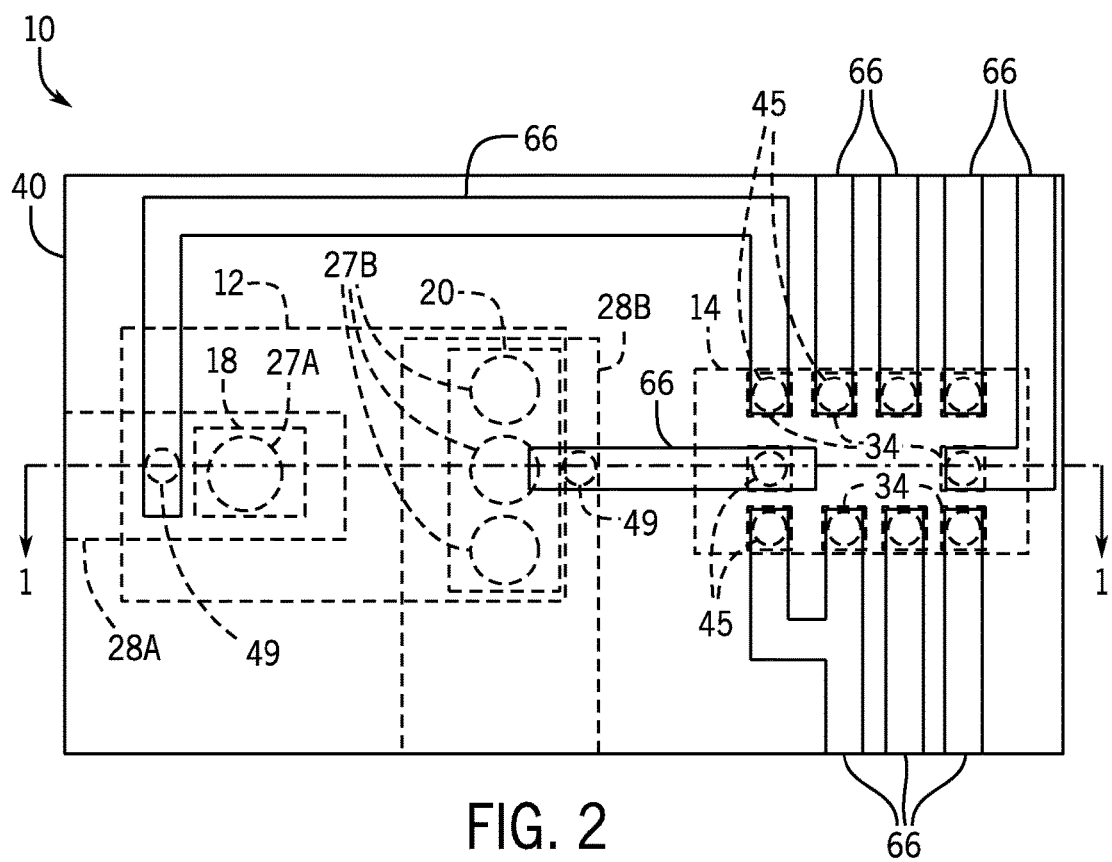
FIG. 2 is a top view of the electronics package of FIG. 1.

A topside view of the electronics module 10 is provided in FIG. 2 to more clearly illustrate an exemplary layout of macro-vias 26, first interconnect layer 28, micro-vias 44, and second interconnect layer 52 relative to the power semiconductor chip 12 and logic semiconductor chip 14. It will be understood that some of the hidden structures are shown in hidden line, while other hidden structures have been omitted for purposes of clarity.

Power semiconductor chip 12 includes two I/O pads 18, 20 on active surface 16. In the illustrated embodiment, one conductive macro-via 27A extends down to I/O pad 18 and three conductive macro-vias 27B extend down to I/O pad 20. In some preferred embodiments, I/O pad 18 is a gate or base pad and covers a smaller area than I/O pad 20, which could be a drain or collector pad. In this embodiment, conductive macro-via 27A connecting to I/O pad 18 could have a cross-sectional area less than the cross-sectional area of conductive macro-vias 27B connecting to I/O pad 20. First interconnect layer 28 includes two patterned power elements 28A and 28B. The first power element 28A is positioned over the left side of power semiconductor chip 12 and electrically connecting to the I/O pad 18 through the single conductive macro-via 27A. The second power element 28B is positioned over the right side of power semiconductor chip 12 and is electrically connected to I/O pad 20 through the remaining three conductive macro-vias 27B.

In the illustrated embodiment, logic semiconductor chip 14 includes ten I/O pads 34 located under corresponding conductive micro-vias 45. Traces or routing path portions 66 of second interconnect layer 52 electrically couple to corresponding I/O pads 34 through conductive micro-vias 45. Some of the traces 66 interconnect select I/O pads 34 to external contacts. Other traces 66 interconnect other select I/O pads 34 to the I/O pads 18, 20 on power semiconductor chip 12 by interconnecting to portions of first interconnect layer 28 through conductive micro-vias 49.

While power semiconductor chip 12 is illustrated in FIG. 2 as including two I/O pads 18, 20, it may have three or more I/O pads in some alternative embodiments or may include only one topside I/O pad in another alternative embodiment, such as where element 12 is a power diode for example. Likewise, logic semiconductor chip 14 may have as few as four I/O pads 34 or may have more than ten, hundreds, or thousands of I/O pads in alternative embodiments.

Referring now to FIGS. 3-12, a technique for manufacturing the electronics module 10 of FIG. 1 is set forth, according to an embodiment of the invention. A cross-section of the build-up process for a singular electronics module 10 is shown in each of FIGS. 3-12 for ease of visualization of the build-up process. However, one skilled in the art will recognize that multiple electronics packages could be manufactured in a similar manner at the panel level and then singulated into individual electronics packages as desired.

Figure 3:
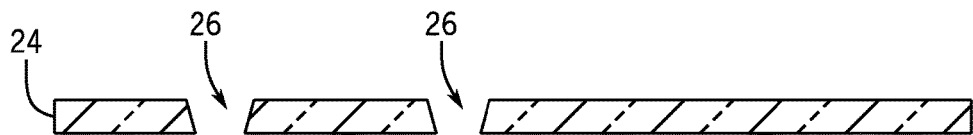
FIGS. 3-12 are schematic cross-sectional side views of the electronics package of FIG. 1 during various stages of a manufacturing/build-up process, according to an embodiment of the invention.

Referring first to FIG. 3, fabrication of electronics module 10 begins by forming macro-via(s) 26 through insulating substrate 24. The size, shape, and location of macro-via(s)

26 are dictated based on the design of the power circuit and the location, size, and current requirements of the power semiconductor chip 12 (FIG. 3). Macro-via(s) 26 may be formed by any standard hole forming process such as laser drilling or ablation, plasma etching, wet etching, water jetting, photo-definition, mechanical punching, mechanical drilling, and the like. In a preferred embodiment, macro-via(s) 26 are formed using a laser cutting process wherein a laser is used to cut a circular hole that defines the outer circumference of the macro-via(s) 26. After the circular hole is formed, the cut out plug of insulating substrate 24 is removed to reveal the completed macro-via 26. In one embodiment, macro-via(s) 26 are formed having angled side surfaces, as shown in FIG. 3, to facilitate the subsequent metal deposition step. Alternatively, macro-via(s) 26 may be straight-sided.

Figure 4:
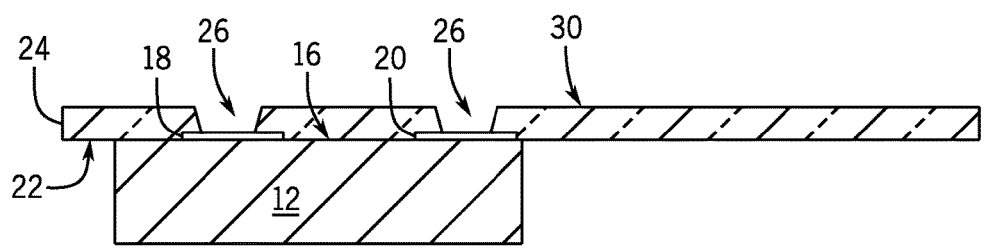

As shown in FIG. 4, the active surface 16 of at least one power semiconductor chip 12 is attached to the bottom surface 22 of insulating substrate 24 such that I/O pad(s) 18, 20 face insulating substrate 24. In some embodiments, insulating substrate 24 is provided in either an uncured or partial cured (i.e., B-stage) form and has adhesive properties, thereby permitting power semiconductor chip 12 to be attached directly to the bottom surface 22 of insulating substrate 24. Alternatively, an adhesive (not shown) can be applied either on the bottom surface 22 of insulating substrate 24 or on the active surface 16 of power semiconductor chip 12 prior to positioning chip 12 on insulating substrate 24. The top surface 30 of insulating substrate 24, macro-via(s) 26, and exposed areas of I/O pads 18, 20 are subsequently cleaned such as through a reactive ion etching (RIE), plasma etch, or chemical etch to perform a desoot process.

Figure 5:
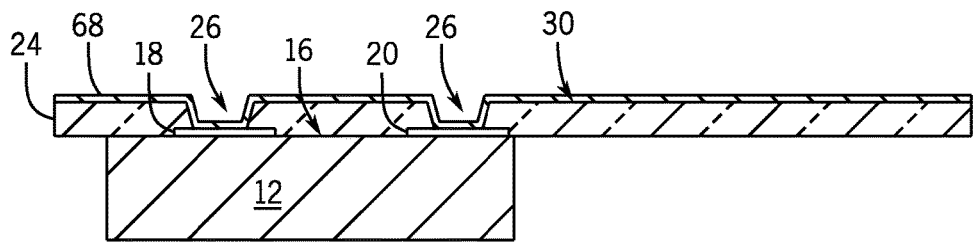
Figure 6:
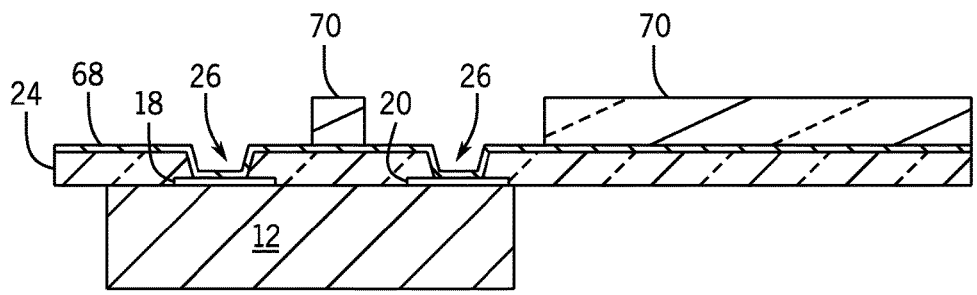
Figure 7:
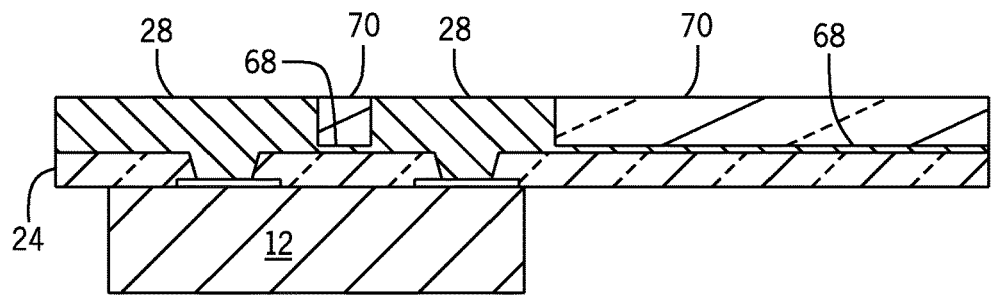

The manufacturing process continues in FIGS. 5-7 by forming and patterning first interconnect layer 28 using a semi-additive plating technique. Manufacture of first interconnect layer 28 begins in FIG. 5 by applying a seed metal 68 to the top surface 30 of insulating substrate 24, onto the side walls of macro-via(s) 26, and onto exposed portions of the I/O pad(s) 18. Seed metal 68 may be applied by sputtering, evaporation, electroless plating, or any other standard metal deposition process. A barrier coating (not shown) can optionally be applied prior to seed metal 68 to enhance adhesion and reliability. When used, the barrier metal likewise may be applied by sputtering, evaporation, or any other standard metal deposition process.

As depicted in FIG. 6, a photoresist mask 70 is applied over the seed metal 68 and photo-patterned to form openings. The photoresist mask 70 can be applied by spray coating, spin coating, or electro plating (electrophoretic resist). The thickness of the photoresist mask 70 is preferably thicker than the thickness 56 of the first interconnect layer 28 (FIG. 1). In a next step of the manufacturing process, shown in FIG. 7, the exposed areas of the seed metal 68 are patterned plated up with a bulk material (e.g., copper) by an electro-plating technique until first interconnect layer 28 reaches a desired thickness 56.

Figure 8:
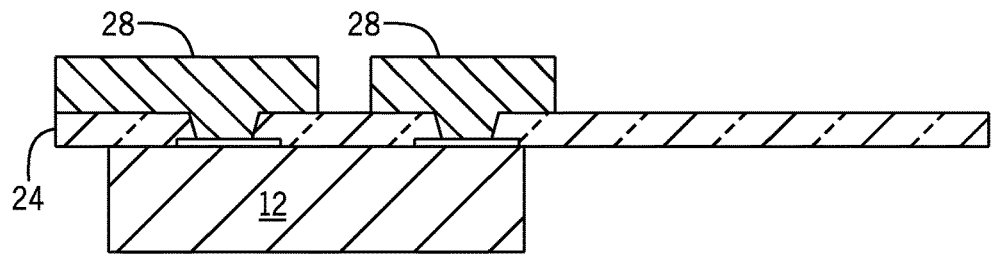

Referring now to FIG. 8, following the patterned plate-up of the first interconnect layer 28, the remaining photoresist mask 70 is removed using a stripping technique to expose the remaining underlying portions of the un-plated seed metal 68. and the exposed portion of seed metal 68 is removed, such as by a subtractive etching process, leaving the completed first interconnect layer 28.

It is to be understood that the technique described with respect to FIGS. 6-8 illustrates only one exemplary technique for manufacturing first interconnect layer 28. Thus, first interconnect layer 28 may be formed using any known metallization and patterning techniques such as, for example, fully subtractive patterning, semi-additive pattern plate-up, or additive plate-up. In yet other embodiments, first interconnect layer 28 is a printed conductive material formed using a deposition technique such as inkjet printing, screen printing, or dispensing, as non-limiting examples. In yet another alternative embodiment, manufacture of electronics module 10 may begin by providing an insulating substrate 24 that includes pre-plated layer of conductive material.

Figure 9:
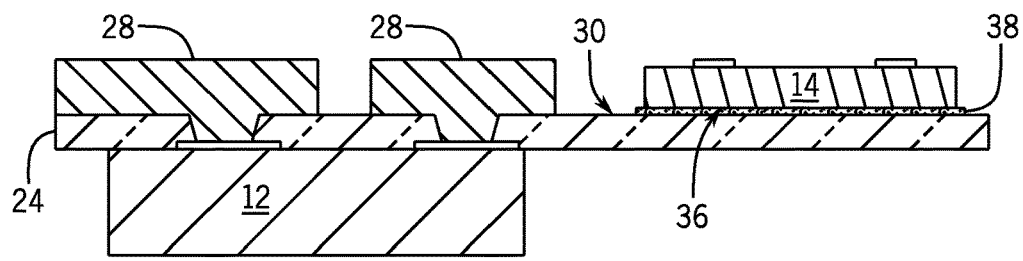

Next, the backside surface 36 of at least one logic semiconductor chip 14 is coupled to the top surface 30 of insulating substrate 24, as shown in FIG. 9. In one embodiment, a layer of bonding material 38 is applied to exposed portions of the top surface 30 of the insulating substrate 24. Bonding material 38 may be applied to cover the entire exposed top surface 30 or only to select die or chip attach locations in alternative embodiments. Bonding material 38 is applied by stencil, screen printing, using a direct dispense technique such as ink jetting, or any other known deposition technique. Bonding material 38 is used to affix logic semiconductor chip 14 to insulating substrate 24. In some embodiments, bonding material 38 may be provided in either an uncured or partial cured (i.e., B-stage) form. Alternatively, bonding material 38 may be applied to logic semiconductor chip 14 prior to placement on insulating substrate 24. In yet other embodiments, bonding material 38 may be omitted entirely in cases where insulating substrate 24 has adhesive properties.

Figure 10:
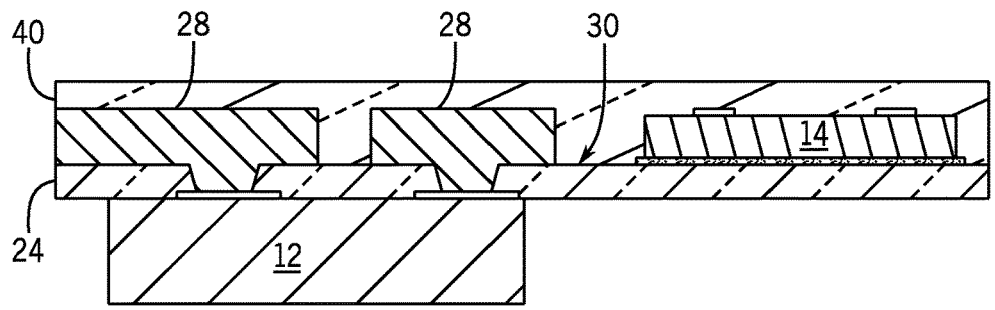

As depicted in FIG. 10, insulating material 40 is next applied over the top surface 30 of insulating substrate 24, the logic semiconductor chip 14, and the first interconnect layer 28, fully embedding the logic semiconductor chip 14 and the first interconnect layer 28. The insulating material 40 may be applied by spray coating, spin coating, meniscus coating, molding, lamination, or any other known process. Insulating material 40 and bonding material 38 (when used) is subsequently cured, thermally or by way of a combination of heat and radiation. Suitable radiation may include UV light and/or microwaves. In one embodiment, a partial vacuum and/or above atmospheric pressure may be used to promote the removal of volatiles from the bonding material 38 during cure if any are present. Optionally, the top surface 46 of the cured insulating material 40 may be planarized using a technique such as mechanical grinding.

Figure 11:
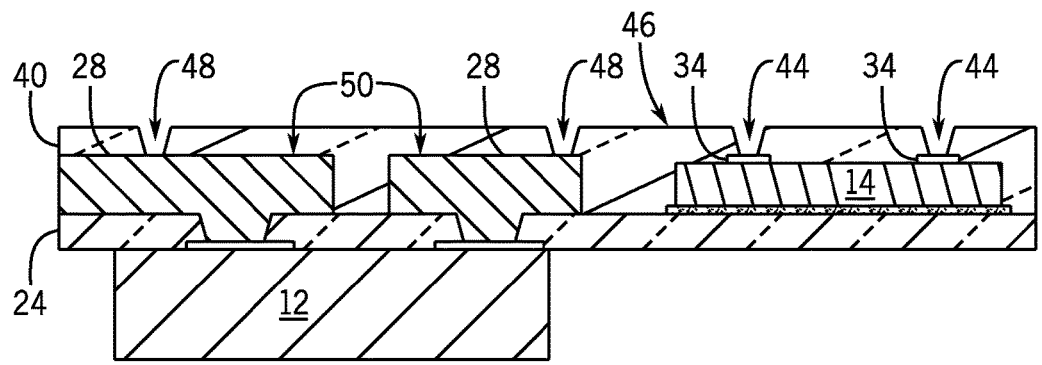

Referring now to FIG. 11, a plurality of micro-vias 44 are formed from a top surface 46 of the insulating material 40 down through a portion of the underlying insulating material 40 to the I/O pads 34 of logic semiconductor chip 14. In some embodiments, one or more additional micro-vias 48 are formed down to expose portions of the top surface 50 of first interconnect layer 28. Micro-vias 44, 48 may be formed by a UV laser drilling, chemical etching, or photo-definition process, as non-limiting examples. Alternately, micro-vias 44, 48 may be formed by way of other methods including: plasma etching, dry and wet etching, or other laser techniques like CO2 and excimer. In one embodiment, micro-vias 44, 48 are formed having angled side surfaces, as shown in FIG. 11, to the facilitate conducive material deposition depicted in FIG. 12. In alternative embodiments micro-vias 44, 48 are formed having straight side surfaces.

Figure 12:
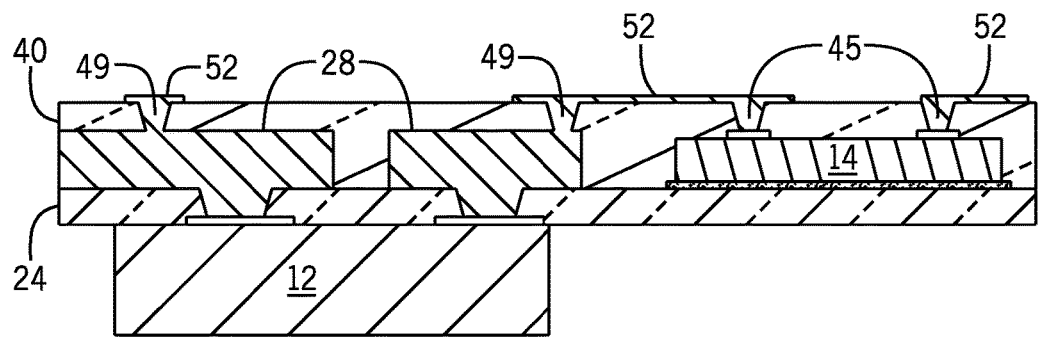

Second interconnect layer 52, shown in FIG. 12, is then disposed on the top surface 46 of insulating material 40, into micro-vias 44, 48 forming conductive micro-vias 45, 49, and onto exposed portions of the I/O pads 34 of logic semiconductor chip 14. Second interconnect layer 52 may be formed using any of the same techniques described above with respect to first interconnect layer 28. Although conductive micro-vias 45, 49 as depicted in FIG. 12 are filled, in other preferred embodiments the conductive micro-vias 45, 49 are conformal with conductive material on the sidewalls of microvias 44, 48 and on the exposed portions of I/O pads 34 but not entirely filling microvias 44, 48.

Figure 13:
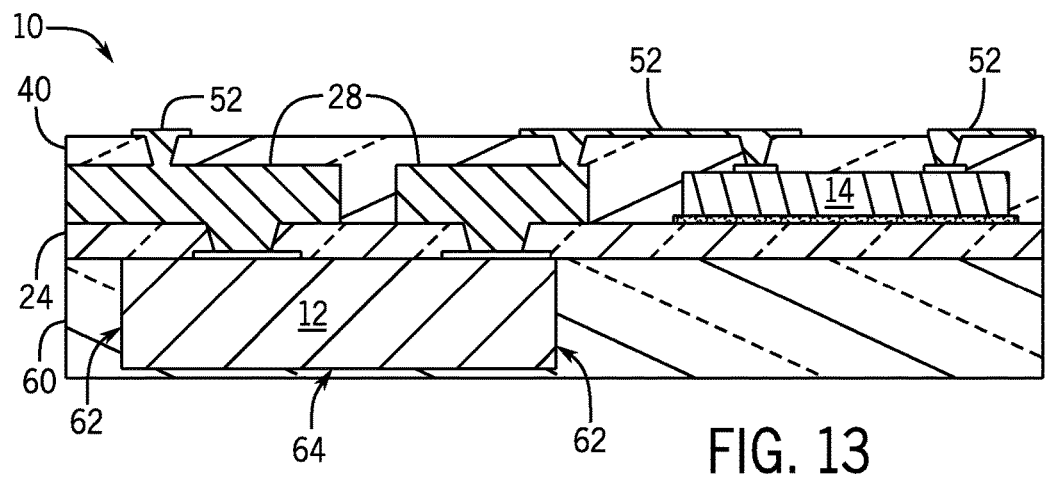
FIG. 13 is a schematic cross-sectional side view of an additional, optional stage of the manufacturing/build-up process depicted in FIGS. 3-12, according to an embodiment of the invention.

As depicted in FIG. 13, a second insulating material 60 is applied over exposed portions of the bottom surface 22 of insulating substrate 24. The insulating material 60 encapsulates at least portions of the side surfaces 62 of the power semiconductor chip 12. Second insulating material 60 may be applied by spray coating, spin coating, meniscus coating, molding, lamination, or any other known process. In some embodiments such as that shown in FIG. 13, the insulating material 60 covers the backside surface 64 of power semiconductor chip 12. Prior to applying insulating material 60, a multilayer conductive substrate or a lead frame can be attached to backside surface 64 to facilitate electrical connection to the at least one power semiconductor chip 12 and to provide a high thermal conductivity cooling path to the electronics module 10 as described in additional detail with respect to FIGS. 20 and 21.

While not illustrated in the drawings, it is contemplated that the manufacturing technique of electronics module 10 may further include application of a solder mask layer over the exposed top surfaces of the second interconnect layer 52 and the insulating material 40 to provide a protective coating and define a location for interconnect pads. These interconnect pads could then subsequently be formed having a metal finish, such as Ni or Ni/Au, to aid solderability. A series of input/output (I/O) connections would then be formed to provide a route for electrical connections between the power semiconductor chip 12, logic semiconductor chip 14, and external components (not shown) such as, for example a busbar or printed circuit board (PCB). Such I/O connections may be provided in the form of plated bumps or pillar bumps, as non-limiting examples.

FIGS. 14-21 illustrate electronics modules according to alternative embodiments of the invention. Each of the illustrate electronics modules includes a number of similar components as electronics module 10 of FIG. 1. Therefore, part numbers used to indicate components in FIG. 1 will also be used to indicate similar components in FIGS. 14-21 as appropriate.

Figure 14:
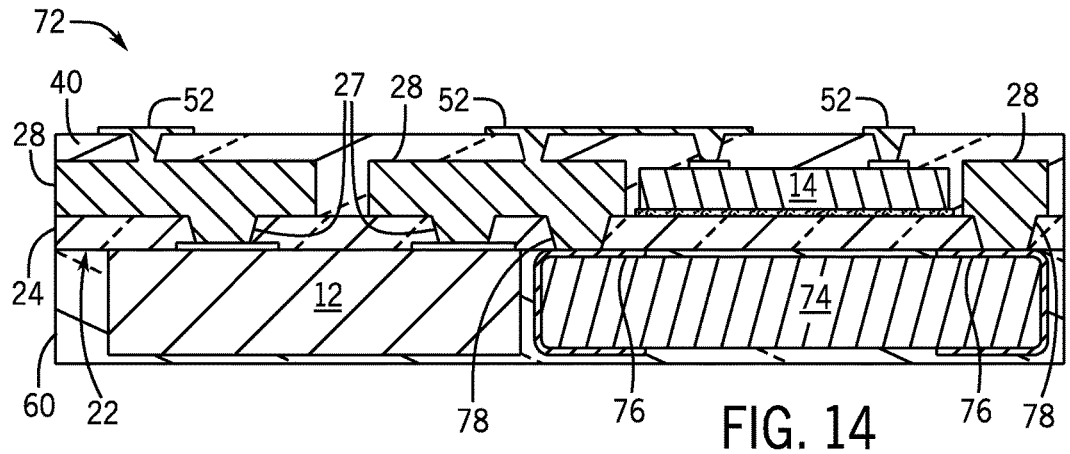
FIG. 14 is a schematic cross-sectional view of an electronics package that includes a passive component, according to another embodiment of the invention.

Referring first to FIG. 14, electronics module 72 includes at least one discrete passive component 74 coupled to the bottom surface 22 of insulating substrate 24. In one embodiment, discrete passive component 74 is a power passive component such as a capacitor, an inductor, a resistor, or a transformer, as examples, which operates at high voltage and/or current levels. Discrete passive component 74 includes terminals 76 located on its two opposing ends. Additional conductive macro-vias 78 extend through insulating substrate 24 and are aligned with terminals 76. First interconnect layer 28 extends into these additional macro-vias 78 and onto exposed portions of terminals 76, thereby electrically connecting first interconnect layer 28 to discrete passive component 74.

Figure 15:
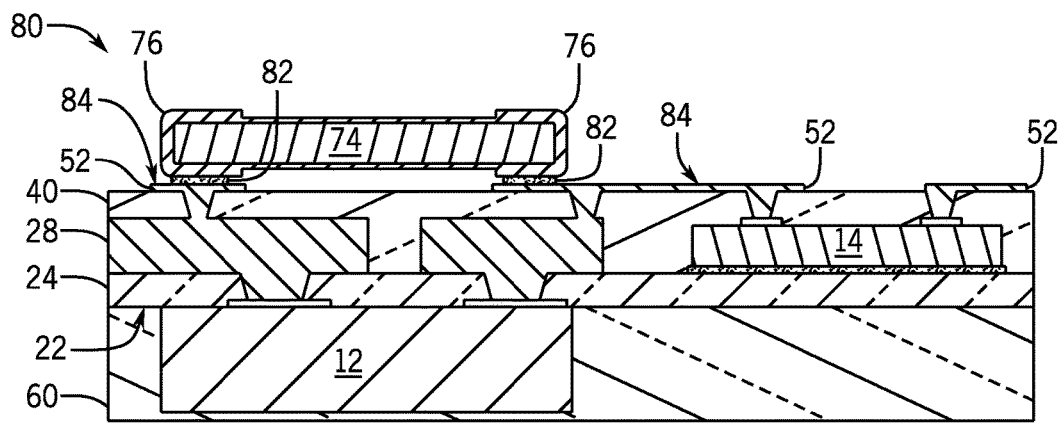
FIG. 15 is a schematic cross-sectional view of an electronics package that includes a passive component, according to another embodiment of the invention.

In the alternative embodiment illustrated in FIG. 15, electronics module 80 includes a discrete passive component 74 that mounted atop a portion of the second interconnect layer 52. In this embodiment, the discrete passive component 74 may be a signal passive component that operates at low voltage and/or current levels, such as a gate driver passive component as one example. The terminals 76 of discrete passive component 74 are electrically coupled to the second interconnect layer 52 by way of a conductive attach material 82 disposed on the top surface 84 of second interconnect layer 52. Conductive attach material 82 may be a solder, a conductive adhesive, or other known electrically conductive joining material.

Figure 16:
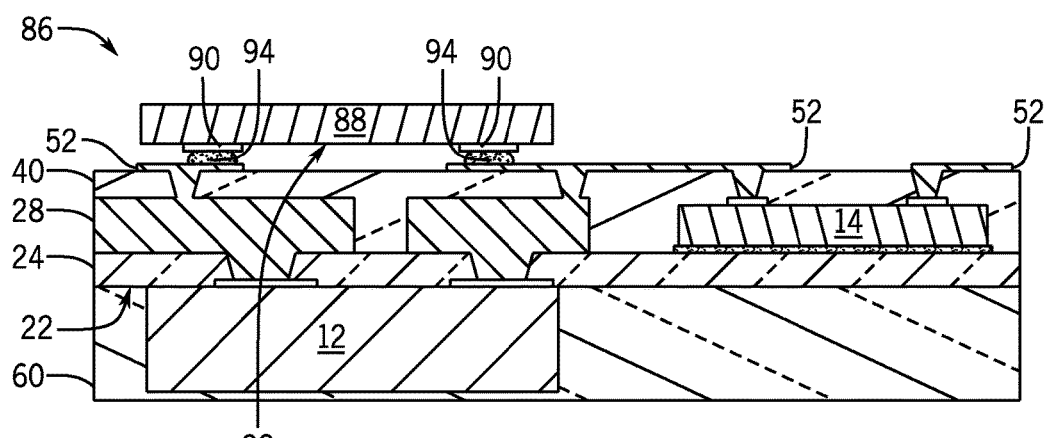
FIG. 16 is a schematic cross-sectional view of an electronics package that includes a passive component, according to yet another embodiment of the invention.

FIG. 16 depicts an alternative embodiment of an electronics module 86 that includes an integrated passive device 88. This integrated passive device 88 may be, for example, a network of multiple resistor, capacitor and/or inductor components fabricated on a common substrate such as, for example, a ceramic or a semiconductor substrate. I/O terminals 90 are formed on a bottom surface 92 of the integrated passive device 88. The I/O terminals 90 are mechanically and electrically coupled to the top surface 84 of the second interconnect layer 52 by way of a conductive attach material 94, such as, for example, solder or conductive adhesive, or other conductive joining material.

Figure 17:
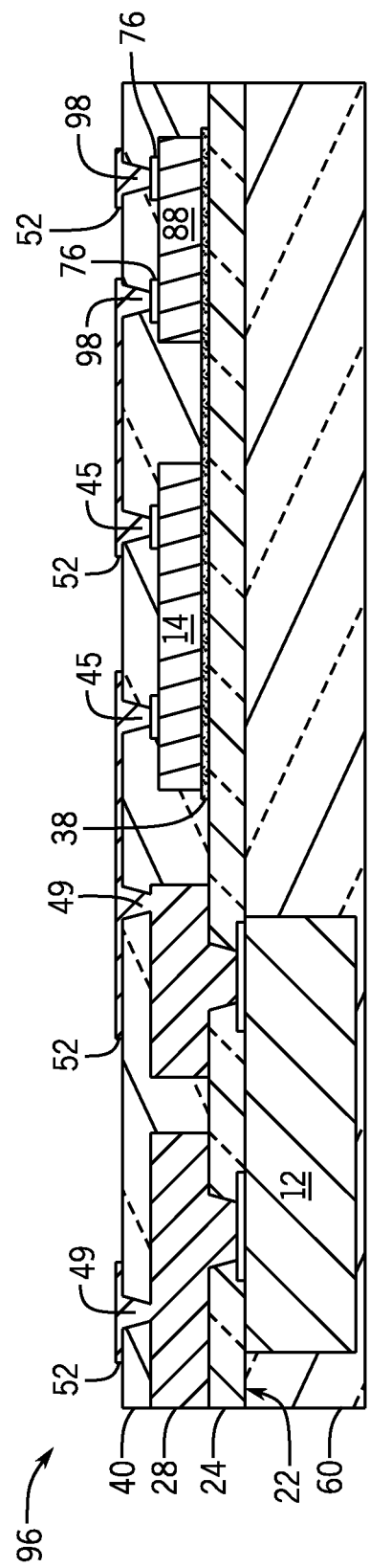
FIG. 17 is a schematic cross-sectional view of an electronics package that includes a passive component, according to another embodiment of the invention.

In yet another alternative embodiment, the electronics module 96 illustrated in FIG. 17 includes an integrated passive device 88 coupled to the insulating substrate 24 and covered by the insulating material 40. Similar to logic semiconductor chip 14, integrated passive device 88 may be coupled to the insulating substrate 24 by way of bonding material 38. Additional conductive micro-vias 98 extend through a portion of the insulating material 40 to expose the I/O terminals 76 of integrated passive device 88. As shown in FIG. 17, the second interconnect layer 52 extends through these additional micro-vias 98 to electrically couple with I/O terminals 76.

Figure 18:
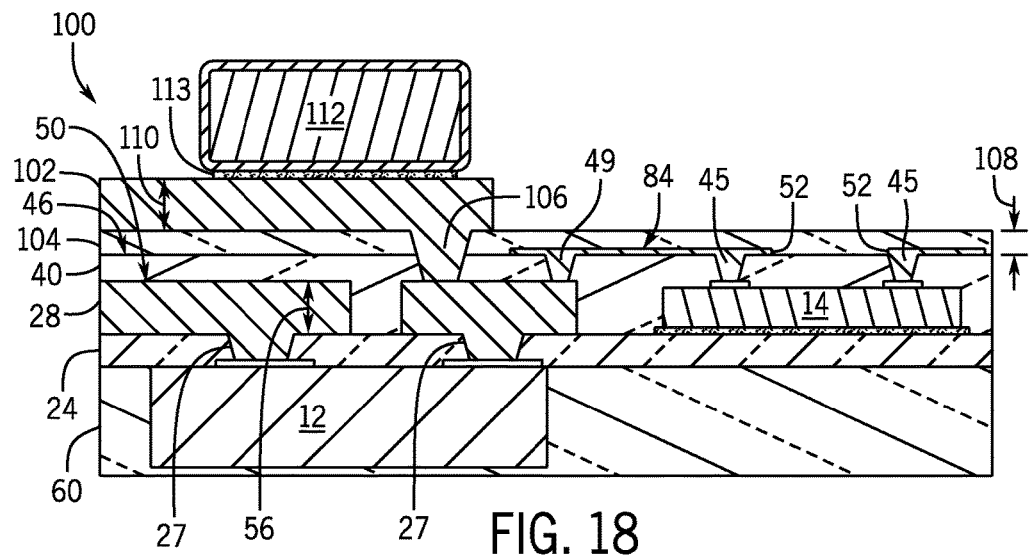
FIG. 18 is a schematic cross-sectional view of an electronics package that includes an additional power interconnect layer, according to another embodiment of the invention.

FIG. 18 depicts yet another alternative embodiment of an electronics module 100 that includes a third conductive interconnect layer 102 that functions as another power interconnect layer. The third interconnect layer 102 is formed over an additional layer of insulating material 104 that is applied over the exposed top surface 46 of insulating material 40 and the top surface 84 of second interconnect layer 52. Insulating material 104 may be formed from any of the materials described with respect to insulating material 40 and using of the same manufacturing techniques. At least one conductive macro-via 106 extends through the thickness 108 of the insulating material 104 and through a portion of the insulating material 40 between the top surface 46 of the insulating material 40 and the top surface 50 of the first interconnect layer 28. The third interconnect layer 102 is patterned on the insulating material 104 and is electrically coupled with the first interconnect layer 28 by way of the at least one conductive macro-via 106. Third interconnect layer 102 has a thickness 110 that is preferably equal to or substantially equal to first interconnect layer 28. Likewise, the at least one macro-via 106 has a cross-sectional area that is equal to or substantially equal to that of macro-via(s) 27. An optional discrete passive component 112, may be mounted to the top surface of the third interconnect layer 102 by a conductive joining material 113 such as solder or conductive adhesive as non-limiting examples. In other embodiments of electronics module 100, third interconnect layer 102 may be substantially thicker than or substantially thinner than first interconnect layer 28 but still substantially thicker than second interconnect layer 52 based upon the design requirements of the electronics module 100.

Figure 19:
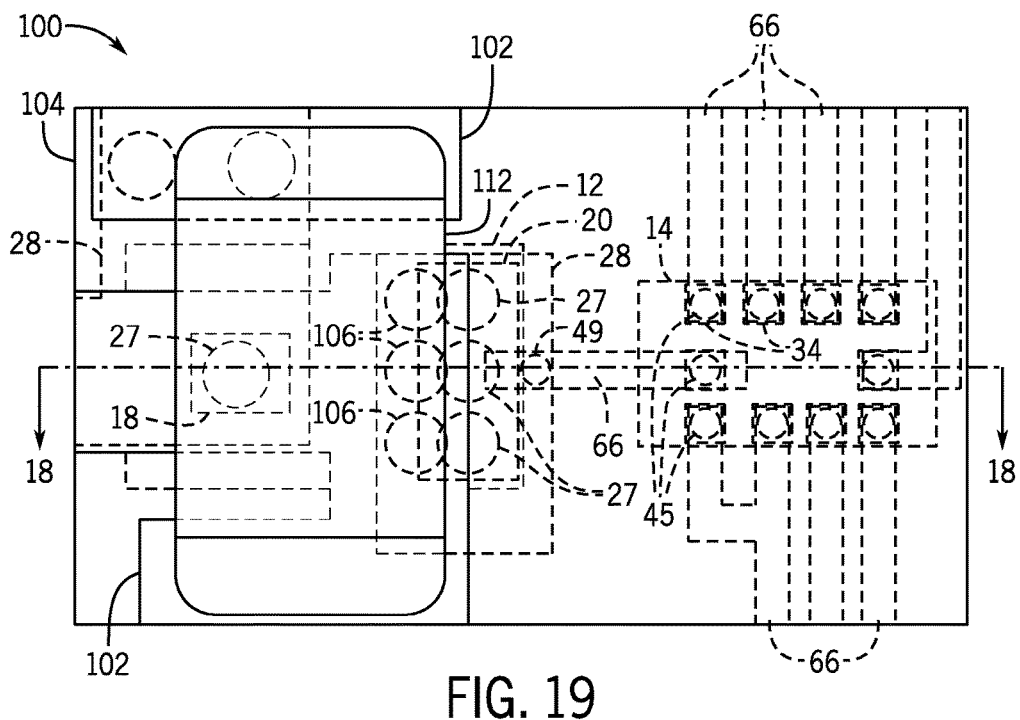
FIG. 19 is a top view of the electronics package of FIG. 18.

A top view of electronics module 100 is provided in FIG. 19 to illustrate an exemplary layout of first interconnect layer 28, second interconnect layer 52, and third interconnect layer 102 relative to power semiconductor chip 12, logic semiconductor chip 14, and optional discrete passive component 112. Optional discrete passive component 112 is electrically coupled to first interconnect layer 28 through conductive macro-vias 106 that extend through portions of insulating material 104 and insulating material 40.

In the illustrated embodiment, logic semiconductor chip 14 includes ten I/O pads 34 located under corresponding micro-vias 45. Traces 66 of second interconnect layer 52 are electrically coupled to I/O pads 34 through respective micro-vias 45. Some traces 66 may be formed to electrically couple I/O pads 34 to external contacts, other traces 66 may be formed to interconnect select I/O pads 34 to I/O pad 18 and/or I/O pad 20 of power semiconductor chip 12.

Similar to the embodiment described with respect to FIGS. 1 and 2, power semiconductor chip 12 may include one I/O pad or three or more I/O pads in alternative embodiments. Likewise, logic semiconductor chip 14 may have as few as four I/O pads 34 or may have more than ten, hundreds, or thousands of I/O pads in alternative embodiments.

Referring now to FIG. 20, electronics module 114 includes a power substrate 116 that is coupled to the backside surface 64 of power semiconductor chip 12. Back side electrical interconnect structure or power substrate 116 may be an encapsulated metal lead frame or a multi-layer substrate such as, for example, a printed circuit board (PCB) or DBCu substrate as shown in the illustrated embodiment that includes an inorganic ceramic substrate with upper and lower sheets of copper bonded to both sides thereof with a direct bond copper interface or braze layer. Preferably, power substrate 116 is constructed to provide high current carrying capability, high voltage isolation, and high thermal conductivity. In the illustrate embodiment, power substrate 116 is composed of an electrically insulating substrate 118, a top side patterned conductive layer 120, and a bottom side conductive layer 122. The electrically insulating substrate 118 may be an inorganic dielectric having a low coefficient of thermal expansion and a high thermal conductivity such as AlN, SiC, or Si. Top side and bottom side conductive layers 120, 122 are preferably a highly electrically conductive metal, such as, for example, copper.

The electrical connection between conductive substrate 116 and power semiconductor chip 12 is made through a conductive joining layer 124, such as solder, silver paste, or a conductive adhesive as examples, which is formed on a lower contact pad 126 that is located on the backside surface 64 of power semiconductor chip 12. In such an embodiment, the connection between conductive substrate 116 and the lower contact pad 126 of power semiconductor chip 12 is preferably made prior to filling the volume between the conductive substrate 116 and the insulating substrate 24 with insulating material 60.

In one embodiment, electronics module 114 of FIG. 20 may include an optional vertical connection element 128 (shown in phantom) that provides means of top side-to-bottom side electrical connection. As shown in FIG. 20, vertical connection element 128 is coupled to the bottom surface 22 of insulating substrate 24. Conductive joining layer 124 mechanically and electrically couples vertical connection element 128 to the bottom side conductive layer 120. A portion of first interconnect layer 28 extends through a macro-via 130 in insulating substrate 24 to electrically couple with the vertical connection element 128. In one embodiment, vertical connection element 128 is provided as part of a prefabricated structure that includes one or more vertical conductors having side surfaces surrounded by an insulating dielectric. In such an embodiment, vertical connection element 128 may include a copper plug 129 surrounded by a ceramic substrate 131, with the top and bottom surfaces of the copper plug left exposed at the top and bottom surfaces of the ceramic substrate. As depicted in FIG. 20, ceramic substrate 131 may comprise a window frame structure with an open center portion wherein power semiconductor 12 is placed. Alternatively, ceramic substrate 131 may be beside power semiconductor 12.

Referring now to FIG. 21, yet another electronics module 132 is illustrated according to another embodiment of the invention. In addition to power semiconductor chip 12, electronics module 132 includes an additional power semiconductor chip 134 that is positioned adjacent power semiconductor chip 12 and coupled to the bottom surface 22 of insulating substrate 24. In one exemplary embodiment, power semiconductor chip 12 is a power semiconductor transistor chip and power semiconductor chip 134 is a power semiconductor diode chip that together form a leg of a typical power circuit. As one skilled in the art will readily recognize, electronics module 132 and the other electronics modules embodiments disclosed herein may contain multiple semiconductor transistor chips interconnected to operate in parallel or multiple power semiconductor diode chips operating in parallel as dictated by design specifications. Additionally, embodiments of the electronics modules disclosed herein may incorporate power semiconductor devices from different legs of a circuit such as a half bridge circuit.

Optionally, electronics module 132 also includes a simplified version of a vertical connection element 136 (shown in phantom) in the form of a plug comprising a highly electrically conductive metal such as copper as one non-limiting example. Optionally, electronics module 132 also includes a simplified back side electrical interconnect structure, such as a lead-frame 138, for example, which includes a patterned conductor layer that provides low resistance I/O structures for the high-power elements of electronics module 132. Power semiconductor chip 12 and power semiconductor chip 134 are electrically and mechanically connected to lead-frame 138 through a conductive joining layer 124, such as solder, silver paste, or a conductive adhesive as examples. The conductive joining layer 124 is positioned on a lower contact pad 126 located on the backside surface 64 of power semiconductor chip 12 and on a lower contact pad 140 located on the backside surface 142 of power semiconductor chip 134. Conductive plug 136 is coupled to the bottom surface 22 of insulating substrate 24 and is coupled to lead-frame 138 by way of conductive joining layer 124. It is contemplated that electronics module 132 may include a more complex, prefabricated vertical connection element similar to vertical connection element 128 of FIG. 20. Likewise, the vertical connection element 128 in FIG. 20 may be replaced by a plug-style connection element similar to vertical connection element 136 of FIG. 21. In addition, power substrate 116 and vertical connection element 128 as depicted in FIG. 20 and lead-frame 138 and vertical connection element 136 depicted in FIG. 21 can be incorporated in any of the electronic modules depicted in FIGS. 1-2 & 13-21.

Beneficially, embodiments of the invention thus provide an embedded electronics package with a multi-thickness interconnect structure that forms electrical connections for power semiconductor chips and logic semiconductor chips that have markedly different voltage and/or current carrying requirements. The multi-thickness interconnect structure has one or more dedicated power interconnect layers that include thick conductive layers, wide traces, and large conductive macro-vias. These macro-vias extend through a thick layer of insulating support substrate that provides a desired level of voltage isolation for the power and logic semiconductor components. The multi-thickness interconnect structure also includes at least one dedicated logic interconnect layer that includes a thin conductive layer with narrow traces that extend through small micro-vias formed in a thin layer of insulating substrate. Because the power interconnect layer(s) and the logic interconnect layer(s) are formed in separate steps of the manufacturing process, the two layers can be formed on different lines of a manufacturing facility using equipment and fabrication processes that optimize the fabrication of a particular layer. For example, the power interconnect layer(s) may be fabricated on a printed circuit board line and the logic interconnect layers(s) may be manufactured on a semiconductor wafer line configured for fabrication of fine line flex patterning (e.g., features sizes of 10 µm or less). The manufacturing process improves yields as compared to prior art, simplifies processing, and reduces costs.

Accordingly, the embodiments described herein facilitate the manufacture of interconnect layers optimized for the design specifications of different types of electrical components that operate at different current and/or voltage levels. The arrangement of the different power and logic interconnect layers within the embedded package structure isolates the interconnection processing of the power interconnect layer(s) from that of the logic interconnect layer(s) while maintaining the layers in close proximity to one another to optimize packaging density. The interconnect structure disclosed herein also beneficially enables the power and logic interconnect layers to be manufactured atop/through different types of insulating materials that have different cure times.

Therefore, according to one embodiment of the invention, an embedded electronics package includes a support substrate, a power semiconductor component coupled to a first side of the support substrate, and a logic semiconductor component coupled to a second side of the support substrate, opposite the first side. A first insulating material surrounds the logic semiconductor component. A logic interconnect layer is electrically coupled to the logic semiconductor component by at least one conductive micro-via extending through a portion of the first insulating material. A first power interconnect layer is electrically coupled to the power semiconductor component by at least one conductive macro-via extending through a thickness of the support substrate. The first power interconnect layer is thicker than the logic interconnect layer.

According to another embodiment of the invention, a method of manufacturing an embedded electronics package includes coupling a power semiconductor component to a first side of a support substrate and forming a power interconnect layer on a second side of the support substrate, the power interconnect layer extending through at least one macro-via in the support substrate to electrically couple with the power semiconductor component. The method also includes coupling a logic semiconductor component to the second side of the support substrate, surrounding the logic semiconductor component in a first insulating material, and forming a logic interconnect layer on a top surface of the first insulating material, the logic interconnect layer extending through at least one micro-via in the first insulating material to electrically couple with the logic semiconductor component, the logic interconnect layer thinner than the power interconnect layer.

According to yet another embodiment of the invention, an electronics package includes an insulating substrate and a first electronic component having an active surface coupled to a first side of the insulating substrate. The active surface has at least one input/output (I/O) pad. The electronics package also includes a second electronic component having a non-active surface coupled to a second side of the insulating substrate and an active surface opposite the non-active surface. A first interconnect layer is coupled to the second side of the insulating substrate and extends through at least one conductive macro-via in the insulating substrate to electrically couple the first interconnect layer to the at least one I/O pad of the first electronic component. The electronics package also includes a second interconnect layer having a thickness less than a thickness of the first interconnect layer. The second interconnect layer extends through at least one conductive micro-via to contact at least one I/O pad on the active surface of the second electronic component.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An embedded electronics package comprising:
   a support substrate;
   a power semiconductor component coupled to a first side of the support substrate;
   a logic semiconductor component coupled to a second side of the support substrate, opposite the first side;
   a first insulating material surrounding the logic semiconductor component;
   a logic interconnect layer electrically coupled to the logic semiconductor component by at least one conductive micro-via extending through a portion of the first insulating material; and
   a first power interconnect layer electrically coupled to the power semiconductor component by at least one conductive macro-via extending through a thickness of the support substrate;
   wherein the first power interconnect layer is thicker than the logic interconnect layer.

2. The embedded electronics package of claim 1 wherein the at least one conductive micro-via comprises a first conductive micro-via and a second conductive micro-via;
   wherein the logic interconnect layer comprises a first trace; and
   wherein the power semiconductor component is electrically coupled to the logic semiconductor component by the first and second conductive micro-vias and the first trace.

3. The embedded electronics package of claim 1 wherein the at least one conductive macro-via has an aspect ratio that is greater than one; and
   wherein the at least one conductive micro-via has an aspect ratio that is less than one.

4. The embedded electronics package of claim 1 wherein the first power interconnect layer is at least two times thicker than the logic interconnect layer.

5. The embedded electronics package of claim 1 wherein the first power interconnect layer is positioned between a portion of the logic interconnect layer and the support substrate.

6. The embedded electronics package of claim 1 further comprising a second insulating material that covers an exposed portion of the first side of the support substrate and surrounds at least a portion of the power semiconductor component.

7. The embedded electronics package of claim 1 wherein a top surface of the first power interconnect layer and an active surface of the logic semiconductor component are co-planar or substantially co-planar.

8. The embedded electronics package of claim 1 further comprising a passive component positioned adjacent the first side of the support substrate and electrically coupled to the first power interconnect layer by at least one of the at least one conductive macro-vias.

9. The embedded electronics package of claim 1 further comprising a passive component positioned atop the logic interconnect layer and electrically coupled thereto.

10. The embedded electronics package of claim 1 further comprising a passive component positioned adjacent the second side of the support substrate and electrically coupled to the logic interconnect layer by at least one of the at least one conductive micro-vias.

11. The embedded electronics package of claim 1 further comprising a second power interconnect layer having a thickness equal to or substantially equal to the thickness of the first power interconnect layer; and
wherein the first and second power interconnect layers are electrically coupled by at least one conductive macro-via positioned therebetween.

12. The embedded electronics package of claim 11 further comprising a passive component positioned atop the second power interconnect layer and electrically coupled thereto.

13. The embedded electronics package of claim 1 further comprising a back side electrical interconnect structure comprising a patterned conductor layer coupled to a back-side surface of the power semiconductor component.

14. The embedded electronics package of claim 13 wherein the back side electrical interconnect structure is a lead frame.

15. The embedded electronics package of claim 13 wherein the back side electrical interconnect structure comprises a multi-layer substrate having a first back side patterned conductor layer, a second back side patterned conductor layer, and an insulating layer positioned between the first back side patterned conductor layer and the second back side patterned conductor layer.

16. The embedded electronics package of claim 13 further comprising at least one vertical connection element comprising;
at least one electrical conductor extending from the top surface to the bottom surface;
wherein a top surface of the electrical conductor is electrically coupled to the first power interconnect layer by at least one of the conductive macro-vias; and
wherein a bottom surface of the electrical conductor is electrically coupled to the first back side patterned conductor layer of back side electrical interconnect structure.

17. A method of manufacturing an embedded electronics package comprising:
coupling a power semiconductor component to a first side of a support substrate;
forming a power interconnect layer on a second side of the support substrate, the power interconnect layer extending through at least one macro-via in the support substrate to electrically couple with the power semiconductor component;
coupling a logic semiconductor component to the second side of the support substrate;
surrounding the logic semiconductor component in a first insulating material; and
forming a logic interconnect layer on a top surface of the first insulating material, the logic interconnect layer extending through at least one micro-via in the first insulating material to electrically couple with the logic semiconductor component, the logic interconnect layer thinner than the power interconnect layer.

18. The method of claim 17 further comprising at least partially surrounding the power semiconductor component with a second insulating material.

19. The method of claim 17 further comprising:
forming a first micro-via in the first insulating material to expose a first contact pad on the logic semiconductor component;
forming a second micro-via in the first insulating material to expose a portion of the power interconnect layer; and
forming the logic interconnect layer to extend through the first micro-via and the second micro-via to electrically couple the logic semiconductor component to the power interconnect layer.

20. The method of claim 17 further comprising:
forming the at least one macro-via using one of a laser cutting, mechanical drilling, mechanical punching, and water jetting technique; and
forming the at least one micro-via using one of an ablation and etching technique.

21. The method of claim 17 further comprising forming the power interconnect layer by plating a conductive material to a thickness at least equal to a thickness of the logic semiconductor component.

22. The method of claim 17 further comprising:
coupling a passive device to one of the first side and the second side of the support substrate; and
electrically connecting the passive device to one of the power interconnect layer and the logic interconnect layer.

23. The method of claim 17 further comprising coupling a back side electrical interconnect structure to the backside surface of the power semiconductor component.

24. The method of claim 23 further comprising electrically coupling the back side electrical interconnect structure to the power interconnect layer through at least one of the at least one macro-via and at least one vertical connection element disposed between the back side electrical interconnect structure and the support substrate.

25. An electronics package comprising:
an insulating substrate;
a first electronic component having an active surface coupled to a first side of the insulating substrate, the active surface having at least one input/output (I/O) pad;
a second electronic component having a non-active surface coupled to a second side of the insulating substrate and an active surface opposite the non-active surface;
a first interconnect layer coupled to the second side of the insulating substrate and extending through at least one conductive macro-via in the insulating substrate to electrically couple the first interconnect layer to the at least one I/O pad of the first electronic component;
a second interconnect layer having a thickness less than a thickness of the first interconnect layer, the second interconnect layer extending through at least one conductive micro-via to contact at least one I/O pad on the active surface of the second electronic component.

26. The electronics package of claim 25 wherein the first electronic component comprises a power semiconductor component and the second electronic component comprises a logic semiconductor component.

27. The electronics package of claim 25 further comprising an insulating material disposed over the first interconnect layer and the second electronic component; and
wherein the at least one conductive micro-via extends through a portion of the insulating material.

28. The electronics package of claim 27 wherein the second interconnect layer is positioned atop the insulating material.

29. The electronics package of claim 25 wherein the at least one conductive micro-via comprises at least another conductive micro-via in contact with the first interconnect layer; and
wherein the second interconnect layer comprises a trace that electrically connects the first interconnect layer to the second electronic component.

30. The electronics package of claim 25 further comprising a passive component electrically coupled to the second interconnect layer.

31. The electronics package of claim 30 wherein the passive component is positioned adjacent the second electronics component on the insulating substrate;
wherein the at least one conductive micro-vias comprise a plurality of conductive micro-vias; and
wherein the passive component is electrically coupled to the second electronics component by at least two of the plurality of conductive micro-vias.

32. The electronics package of claim 25 further comprising:
a third interconnect layer positioned above the first interconnect layer, the third interconnect layer having a thickness equal to or substantially equal to the thickness of the first interconnect layer; and
a passive component positioned atop the third interconnect structure and electrically coupled thereto.

33. The electronics package of claim 25 further comprising a passive component coupled to the first side of the insulating substrate, the passive component electrically coupled to the first interconnect layer by at least one of the at least one conductive macro-vias.

\* \* \* \* \*